(12) United States Patent
Xie et al.

(10) Patent No.: US 11,984,401 B2
(45) Date of Patent: May 14, 2024

(54) STACKED FET INTEGRATION WITH BSPDN

(71) Applicant: International Business Machines Corporation, Armonk, NY (US)

(72) Inventors: Ruilong Xie, Niskayuna, NY (US); Junli Wang, Slingerlands, NY (US); Mukta Ghate Farooq, Hopewell Jct, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 17/304,460

(22) Filed: Jun. 22, 2021

(65) Prior Publication Data

US 2022/0406715 A1 Dec. 22, 2022

(51) Int. Cl.
| | | |
|---|---|---|
| *H01L 23/00* | (2006.01) | |
| *H01L 21/02* | (2006.01) | |
| *H01L 21/8238* | (2006.01) | |
| *H01L 23/528* | (2006.01) | |
| *H01L 27/092* | (2006.01) | |
| *H01L 29/06* | (2006.01) | |
| *H01L 29/417* | (2006.01) | |
| *H01L 29/423* | (2006.01) | |
| *H01L 29/66* | (2006.01) | |
| *H01L 29/786* | (2006.01) | |

(52) U.S. Cl.
CPC .... *H01L 23/5286* (2013.01); *H01L 21/02532* (2013.01); *H01L 21/0259* (2013.01); *H01L 21/823807* (2013.01); *H01L 21/823814* (2013.01); *H01L 21/823864* (2013.01); *H01L 21/823871* (2013.01); *H01L 27/0922* (2013.01); *H01L 27/0924* (2013.01); *H01L 29/0665* (2013.01); *H01L 29/0673* (2013.01); *H01L 29/41733* (2013.01); *H01L 29/42392* (2013.01); *H01L 29/66545* (2013.01); *H01L 29/66553* (2013.01); *H01L 29/66742* (2013.01); *H01L 29/78696* (2013.01)

(58) Field of Classification Search
CPC ............ H01L 23/5286; H01L 27/0922; H01L 27/0924; H01L 29/41733; H01L 29/42392; H01L 29/78696
See application file for complete search history.

(56) References Cited

U.S. PATENT DOCUMENTS

| | | | |
|---|---|---|---|
| 10,388,519 B2 | 8/2019 | Smith | |
| 10,586,765 B2 | 3/2020 | Smith | |
| 2019/0172828 A1 | 6/2019 | Smith | |
| 2020/0075489 A1 | 3/2020 | Liebmann | |
| 2020/0075574 A1 | 3/2020 | Smith | |

(Continued)

FOREIGN PATENT DOCUMENTS

WO 2020055642 A2 3/2020

*Primary Examiner* — Reema Patel
(74) *Attorney, Agent, or Firm* — Stephen R. Yoder

(57) ABSTRACT

A semiconductor device including a hybrid contact scheme for stacked FET is disclosed with integration of a BSPDN. A double-sided (both frontside and backside of the wafer) contact scheme with buried power rail (BPR) and backside power distribution network (BSPDN) provides optimum contact and interconnect. The stacked FET could include, for example, FINFET over FINFET, FINFET over nanosheet, or nanosheet over nanosheet.

8 Claims, 14 Drawing Sheets

SECTION X-X

(56) References Cited

U.S. PATENT DOCUMENTS

| | | |
|---|---|---|
| 2020/0126987 A1* | 4/2020 | Rubin ................. H01L 29/0847 |
| 2020/0212038 A1 | 7/2020 | Rachmady |
| 2020/0266169 A1 | 8/2020 | Kang |
| 2020/0286793 A1 | 9/2020 | Zhang |
| 2021/0035975 A1* | 2/2021 | Kim .................... H01L 27/0688 |
| 2022/0115510 A1* | 4/2022 | Yu ..................... H01L 29/42392 |
| 2022/0181258 A1* | 6/2022 | Liebmann ......... H01L 29/66742 |

* cited by examiner

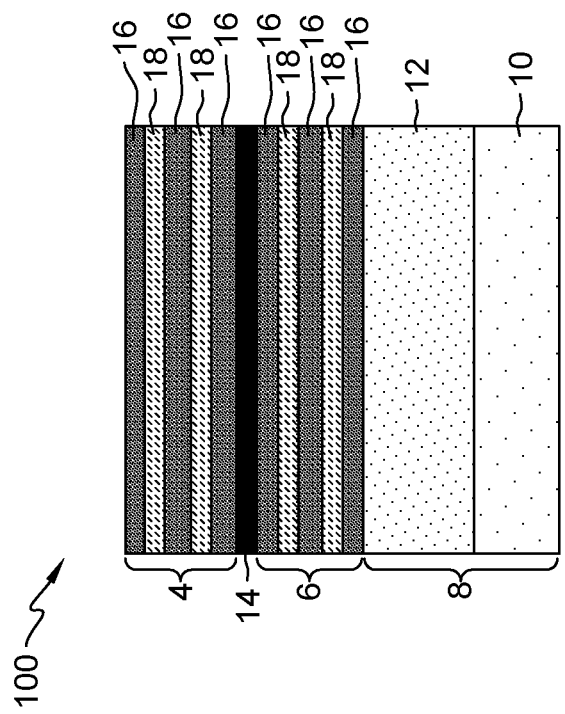
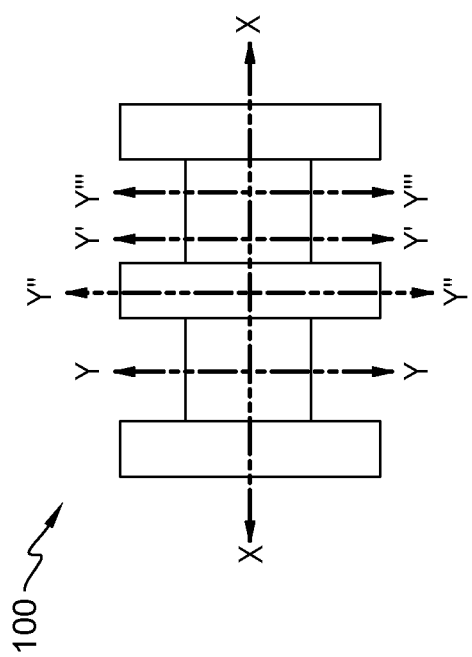

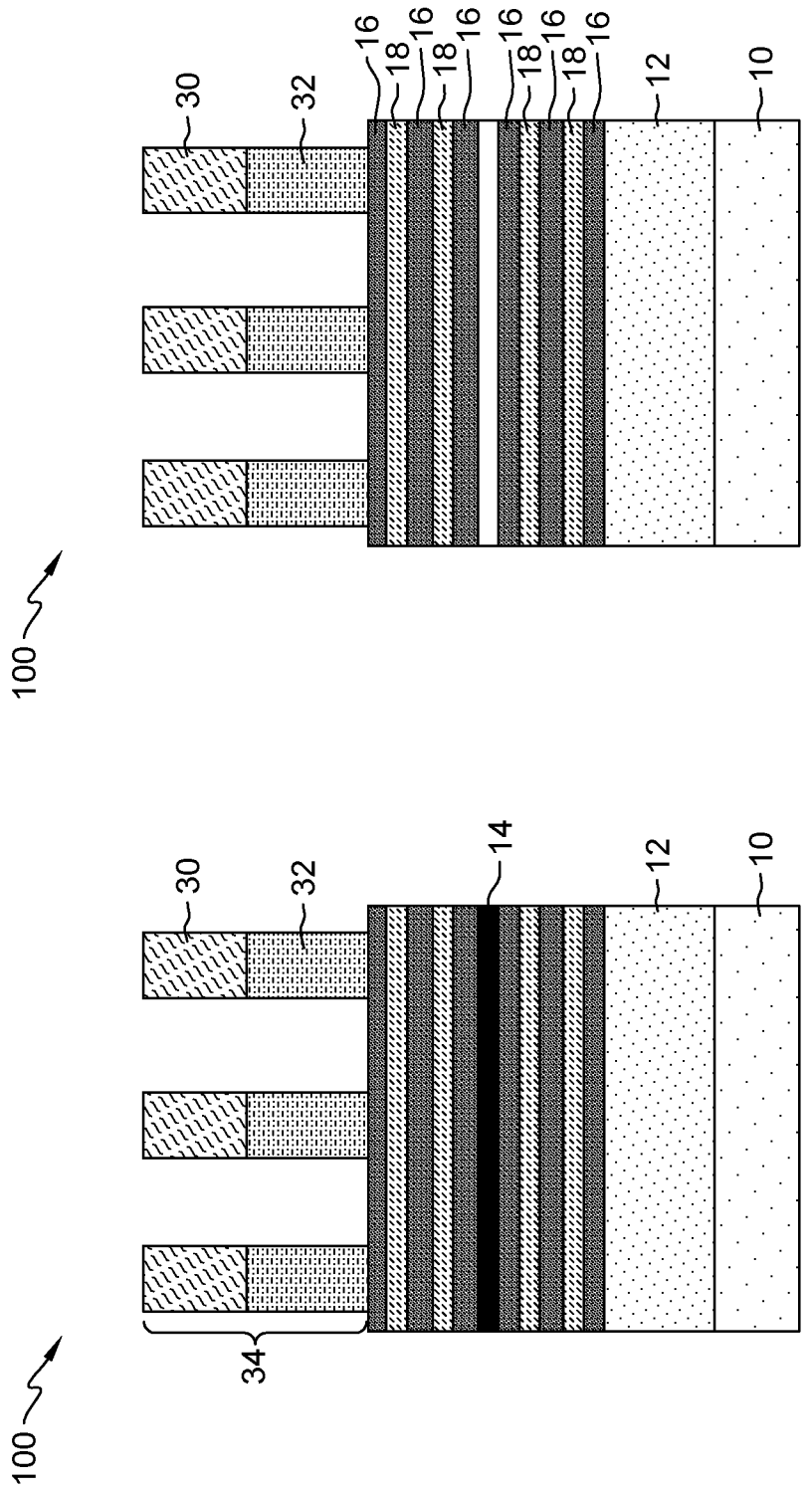

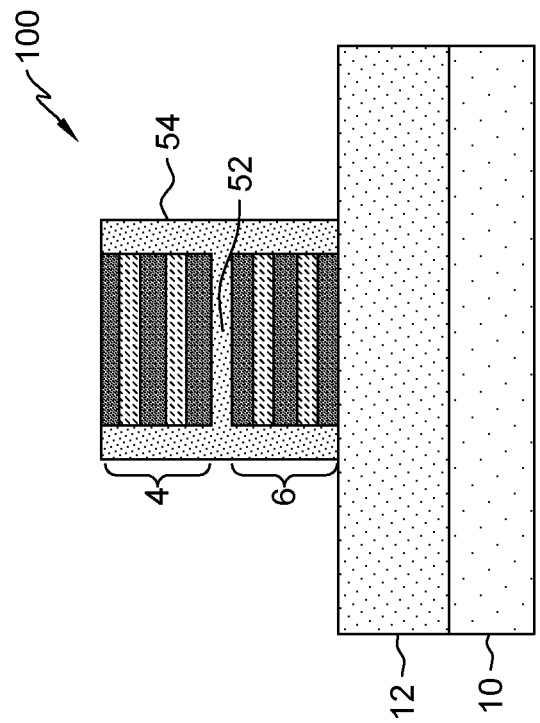
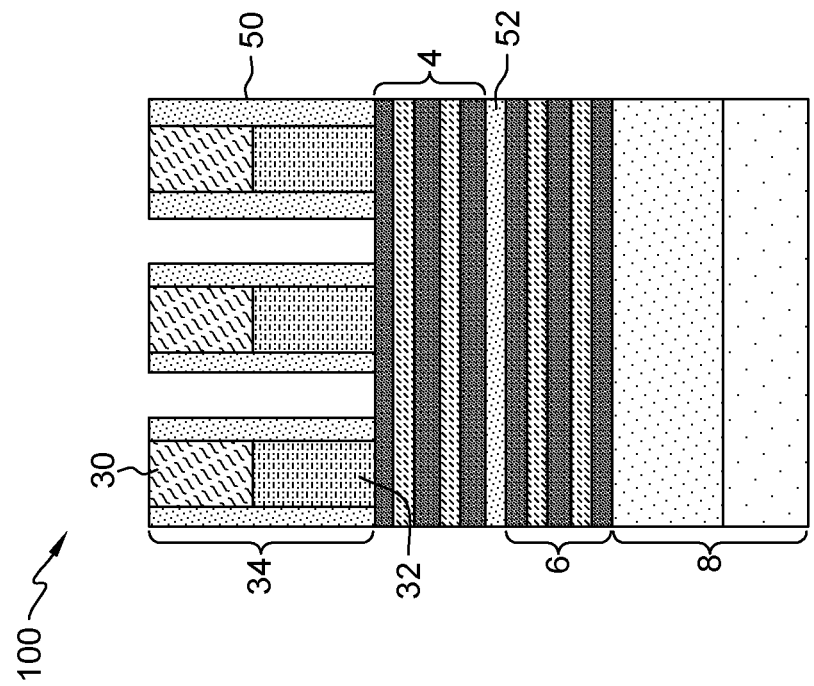
SECTION X-X
FIG. 5A
SECTION Y-Y
FIG. 5B

SECTION X-X

SECTION Y-Y

SECTION X-X

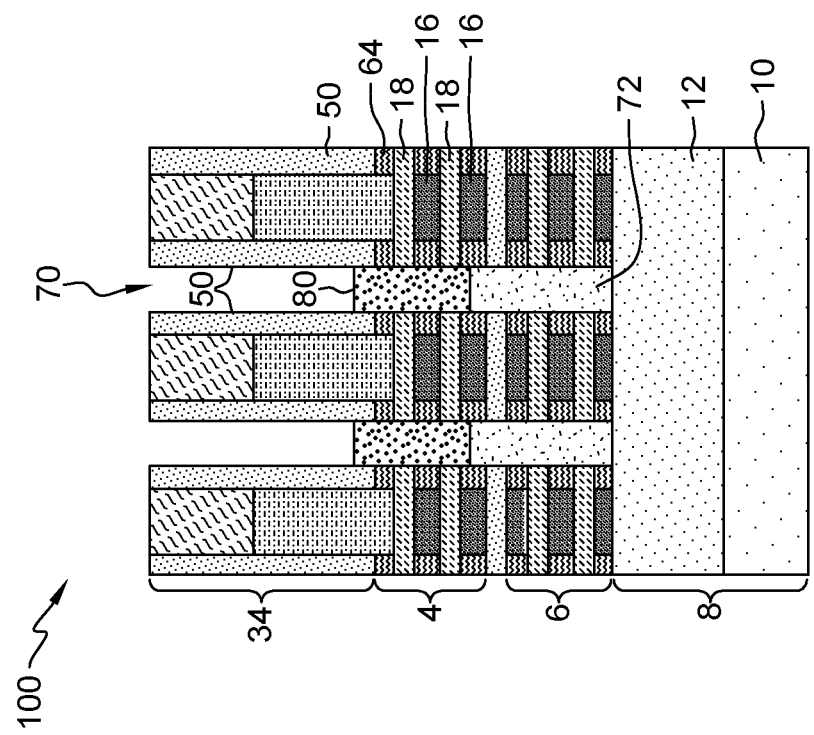
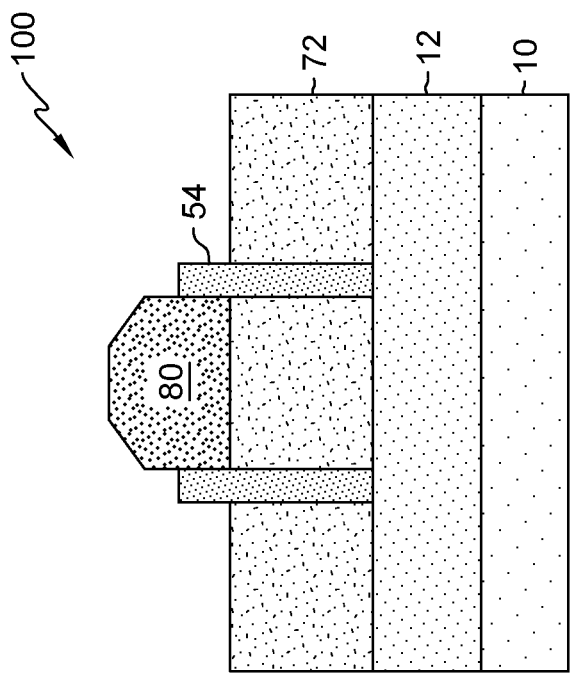
SECTION X-X
FIG. 8A
SECTION Y-Y
FIG. 8B

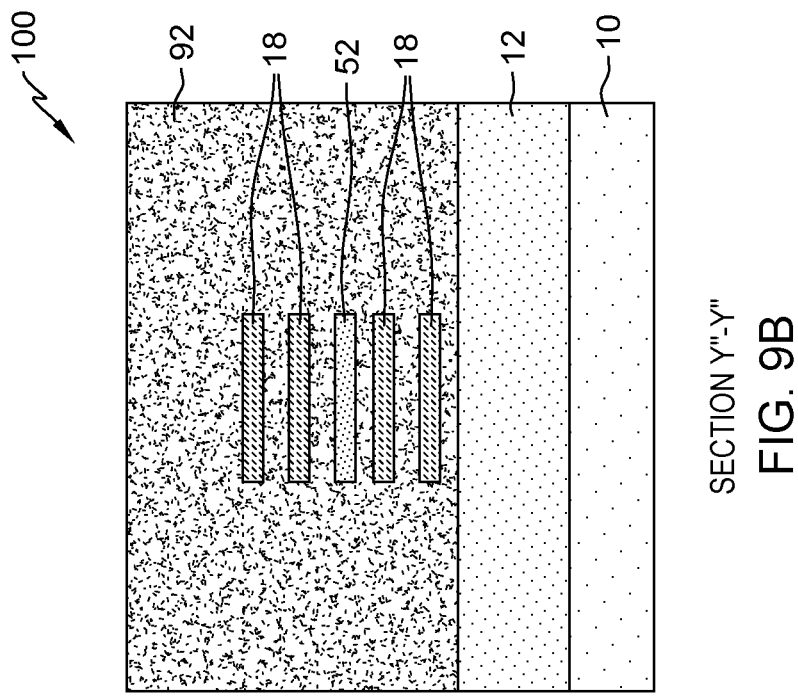
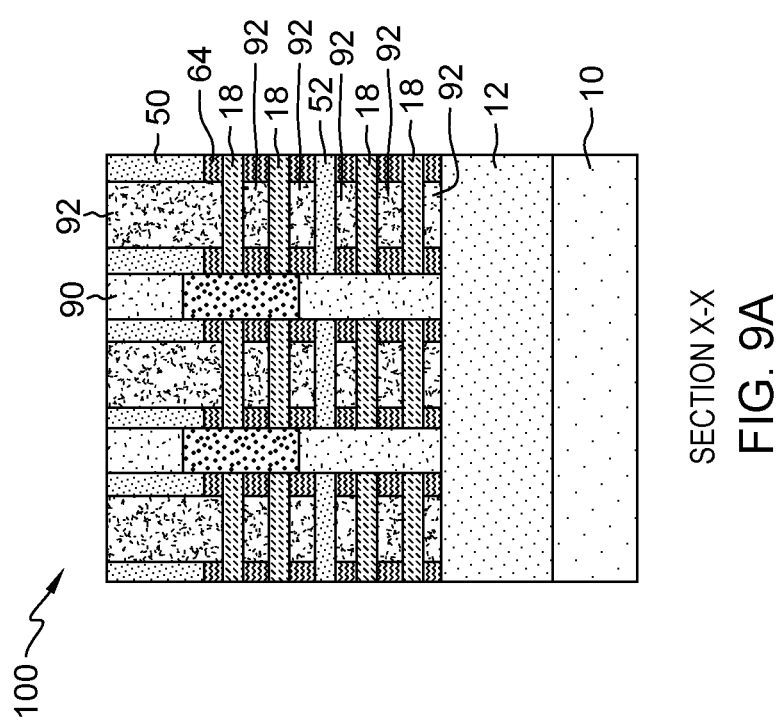

SECTION Y'-Y'

SECTION X-X

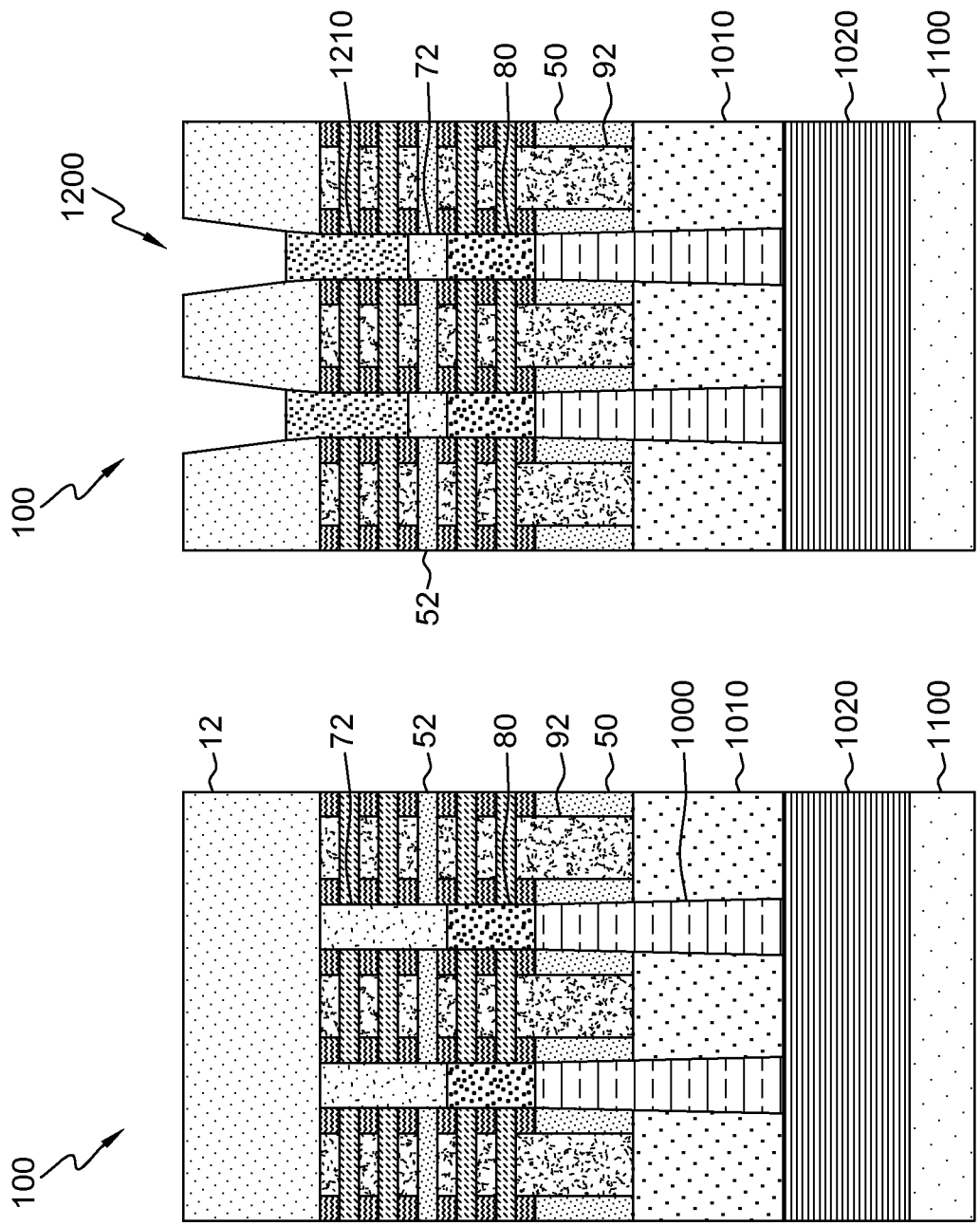

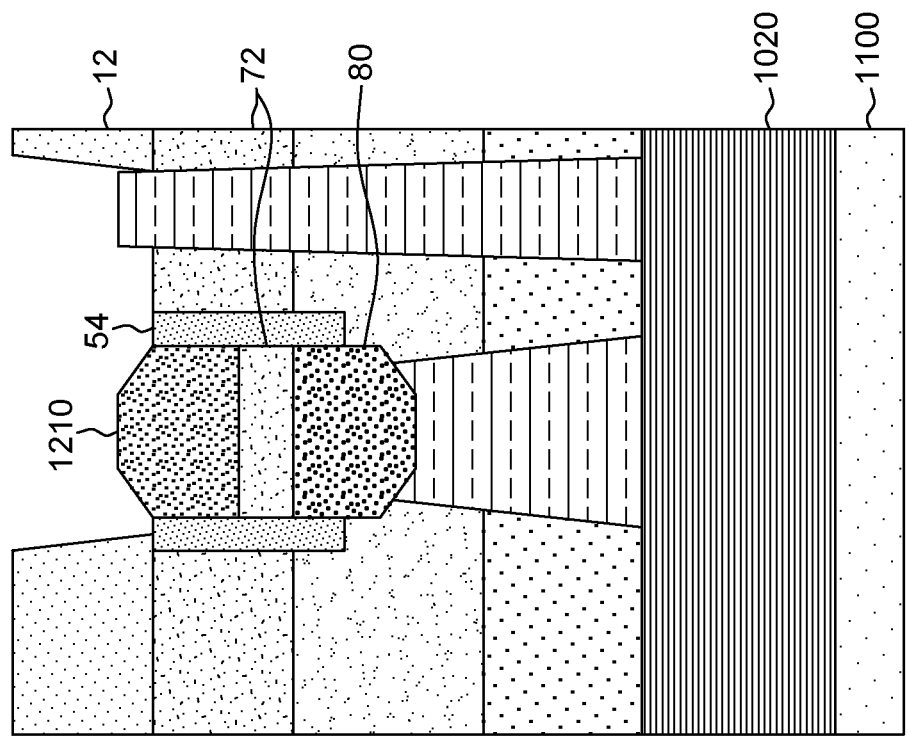
FIG. 12C SECTION Y"-Y"
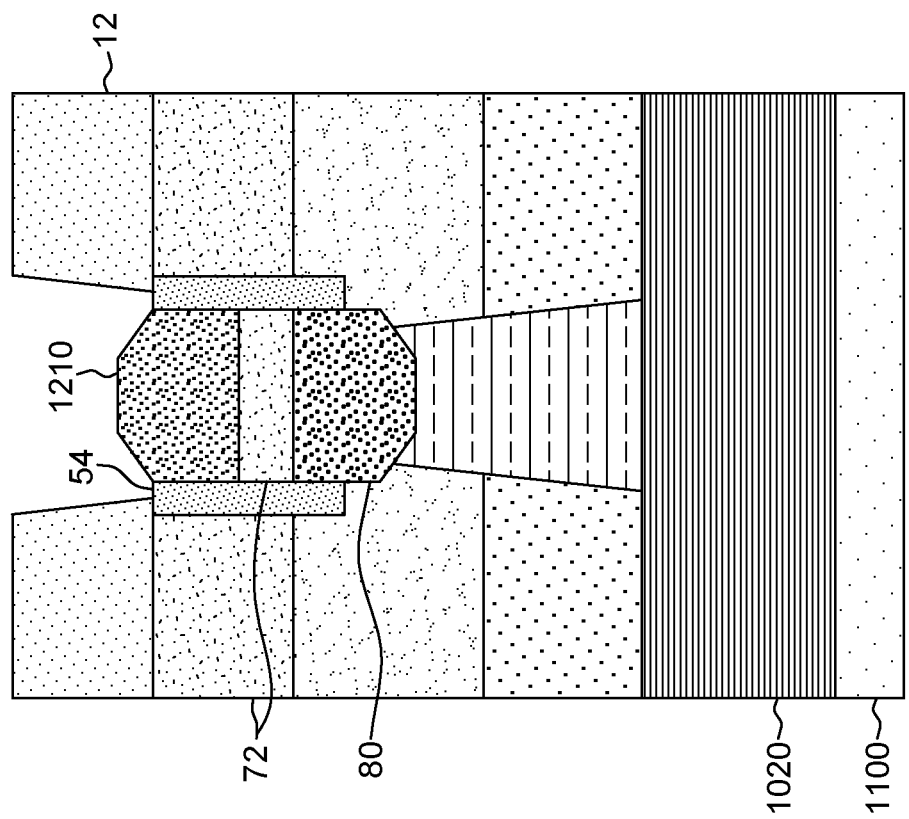
FIG. 12B SECTION Y-Y'

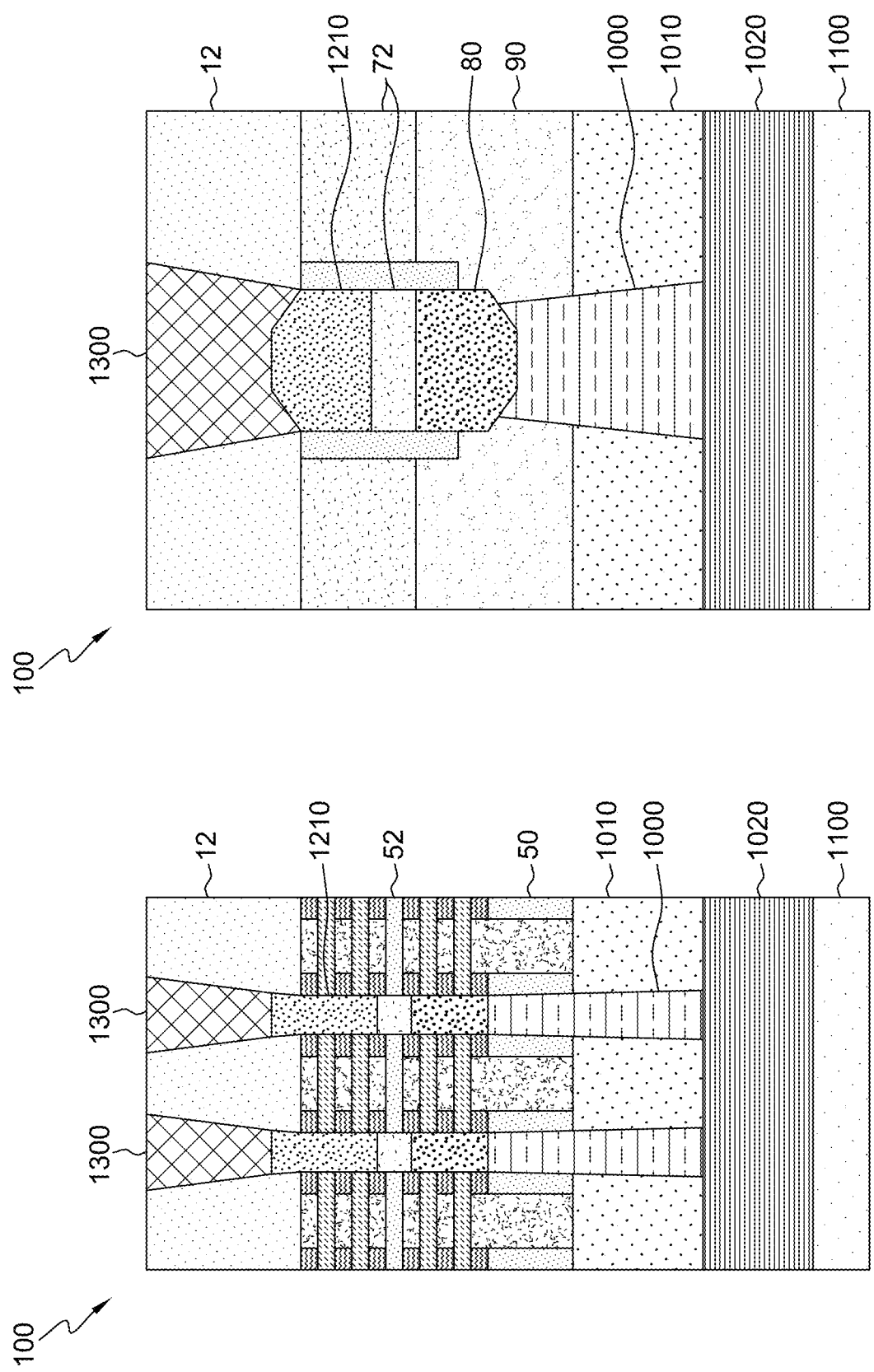

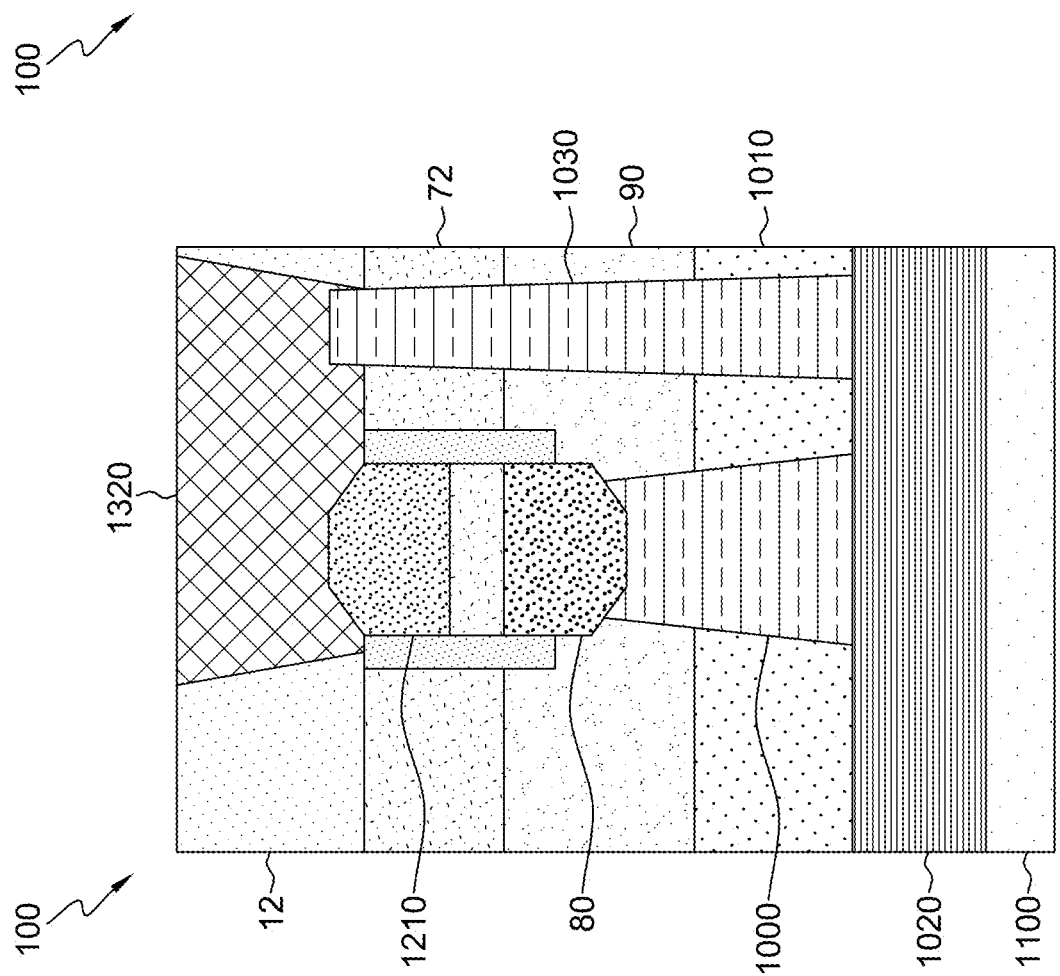
FIG. 13C SECTION Y'-Y'
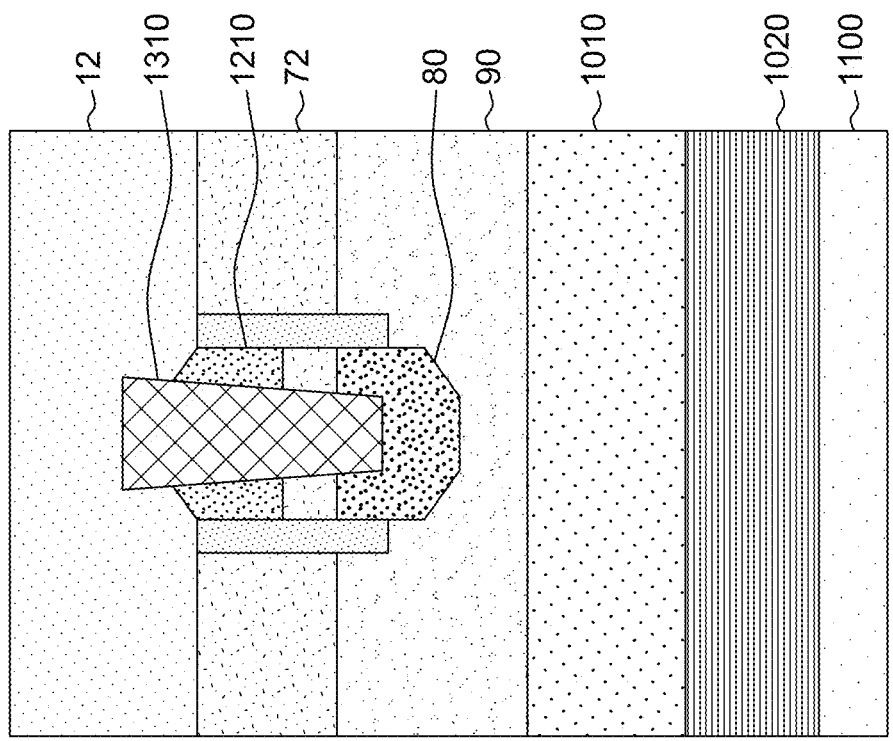
FIG. 13D SECTION Y'''-Y'''

SECTION Y-Y

SECTION X-X

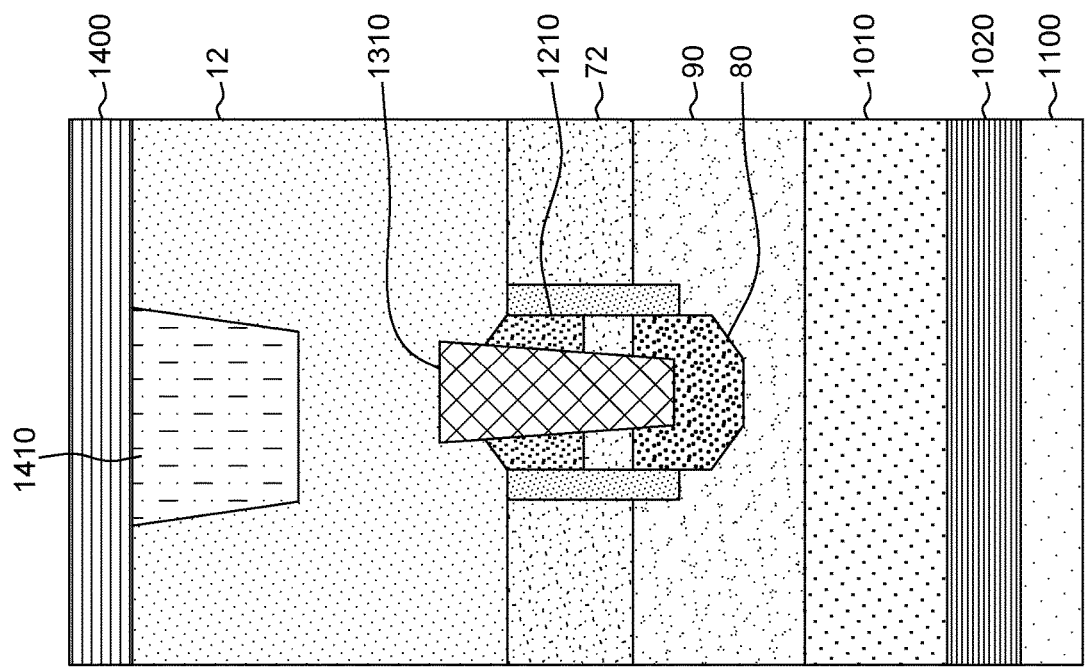
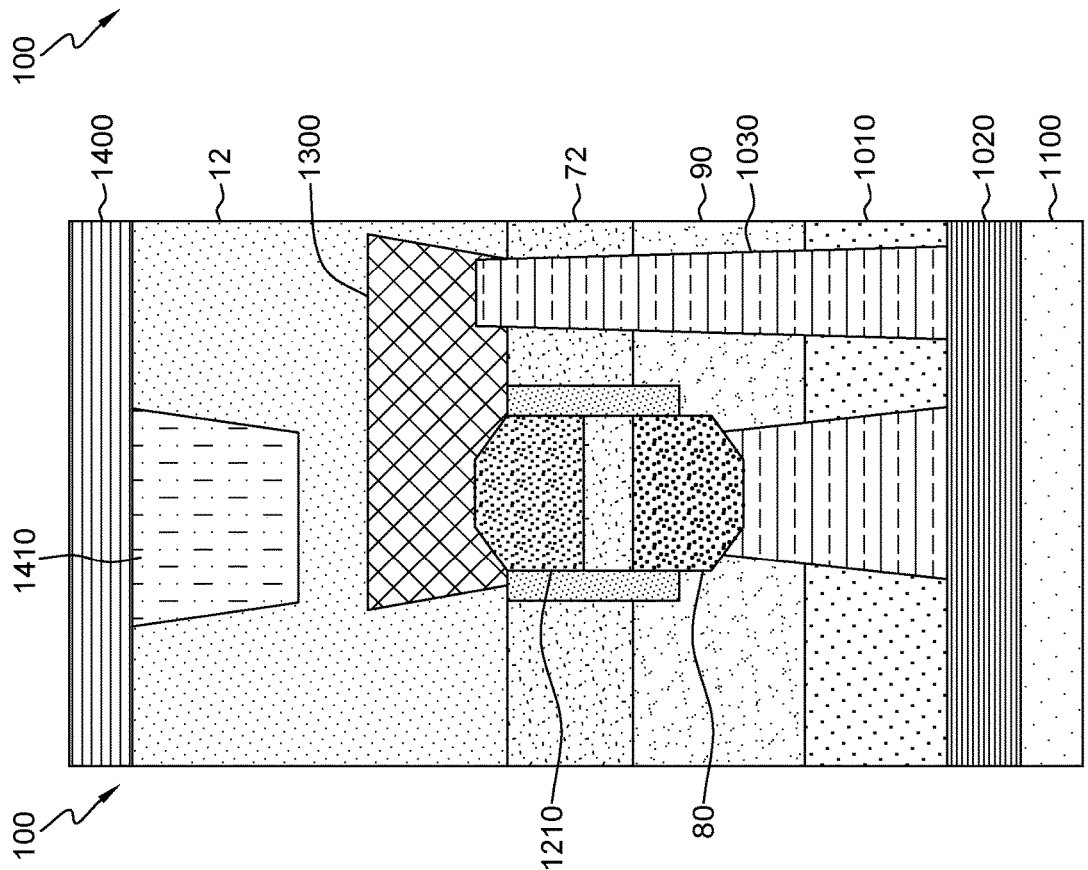

STACKED FET INTEGRATION WITH BSPDN

BACKGROUND

The present invention relates, generally, to the field of semiconductor manufacturing, and more particularly to fabricating stacked field effect transistors with integrated backside power distribution network (BSPDN).

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, stacked FETs help achieve a reduced FET device footprint while maintaining FET device performance. A stacked FET device contains at least one transistor stacking over at least another transistor at the same footprint. However, conventional contact architecture does not fit stacked FET very well because access to bottom S/D epi can be easily blocked by top S/D epi when all contacts are formed from the frontside of the wafer. Extending the bottom S/D epi could avoid this issue however scaling benefits is compromised. In this invention, we improve the contact scheme for stacked FET by utilizing novel contact architectures from both frontside and backside of the wafer.

SUMMARY

According to an embodiment, a semiconductor device is provided. The semiconductor device including a stacked pair of field-effect transistors (FETs) including a top FET and a bottom FET, the bottom FET in contact with a bottom source drain region; a buried power rail (BPR) in contact with the bottom source drain region through a backside local interconnect; and a back end of line (BEOL) layer in contact with the bottom source drain region, wherein the electrical connection is made through a top deep trench contact in contact with the backside local interconnect.

According to an embodiment, a semiconductor device is provided. The semiconductor device including a lower nanosheet stack on a buried insulator layer comprising alternating layers of a first metal gate layer and a semiconductor channel material vertically aligned and stacked one on top of another; an upper nanosheet stack on a dielectric spacer layer comprising alternating layers of the metal gate layer and the semiconductor channel material vertically aligned and stacked one on top of another, the upper nanosheet stack on dielectric spacer layer vertically aligned and stacked on top of the lower nanosheet stack; a pair of inner spacers disposed between adjacent nanosheet stack pairs including a lower nanosheet stack and an upper nanosheet stack, the pair of inner spacers oriented parallel to each other and vertically coplanar with and contacting the adjacent nanosheet stack pairs; an upper source drain region in direct contact with and located in an upper portion of the pair of inner spacers; a lower source drain region in direct contact with and located in a lower portion of the pair of inner spacers, the upper source drain region and the lower source drain region separated by an inter-layer dielectric and bounded vertically by the pairs of inner spacers; located between a first pair of adjacent nanosheet stacks, a backside local interconnect disposed between a buried power rail (BPR) and the lower source drain region, establishing electrical contact between the buried power rail (BPR) and the lower source drain region; and located between a second pair of adjacent nanosheet stacks, a top deep trench contact disposed between a back end of line (BEOL) layer and the backside local interconnect, the backside local interconnect in direct contact with the bottom source drain region, establishing electrical contact between the BEOL layer and the bottom source drain region.

According to an embodiment, a method is provided. The method including forming a nanosheet stack on a substrate, the nanosheet stack comprising an upper nanosheet stack vertically aligned above a silicon germanium layer and a lower nanosheet stack, the upper nanosheet stack and the lower nanosheet stack each comprising alternating layers of a sacrificial material and a semiconductor channel material vertically aligned and stacked one on top of another; recessing the nanosheet stack to a buried insulator layer of the substrate creating trenches between pairs of inner spacers extending between dummy gate stacks; forming upper source drain regions within the trenches between upper portions of the pairs of inner spacers and extending between the dummy gate stacks; forming middle of line contacts, including deep trench contacts extending through an inter-layer dielectric into the buried insulator layer and a back end of line (BEOL) layer; attaching a carrier wafer to the BEOL layer and flipping over the substrate and associated structure such that the BEOL layer is located on the bottom; forming lower source/drain regions within recesses in the inter-layer dielectric and between lower portions of the pairs of inner spacers and between the dummy gate stacks, the upper source drain regions and the lower source drain regions separated by the inter-layer dielectric and bounded vertically by the pairs of inner spacers; forming backside local interconnects to contact the lower source drain regions; and forming a backside buried power rail contacting the backside local interconnects through a backside buried power rail via.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 1 illustrates an upper view of the semiconductor structure.

FIG. 2 illustrates a cross-sectional view of a semiconductor structure at an intermediate stage of fabrication, according to an exemplary embodiment;

FIG. 3 illustrates a cross-sectional view of the semiconductor structure and illustrates selective removal of semiconductor material layers and formation of a dummy gate conductor and a gate hard mask, according to an exemplary embodiment, according to an exemplary embodiment;

FIG. 4 illustrates a cross-sectional view of the semiconductor structure and illustrates selective removal of semiconductor material layers;

FIGS. 5A and 5B each illustrate a cross-sectional view of the semiconductor structure and illustrate removal of select silicon germanium layers and formation of spacers, according to an exemplary embodiment;

FIGS. 8A and 8B each illustrate cross-sectional views of the semiconductor structure and top epitaxial growth, according to an exemplary embodiment;

FIGS. 9A and 9B each illustrate cross-sectional views of the semiconductor structure and illustrate formation of a second inner layer dielectric, dummy gate removal, and a replacement metal gate, according to an exemplary embodiment;

FIG. 11 illustrates a cross-sectional view of the semiconductor structure and carrier wafer and wafer flip, according to an exemplary embodiment;

FIGS. 12A, 12B, and 12C each illustrate cross-sectional views of the semiconductor structure and substrate removal and bottom trench epitaxial growth formation, according to an exemplary embodiment;

FIGS. 13A, 13B, 13C, and 13D each illustrate cross-sectional views of the semiconductor structure and inner layer dielectric deposition and formation of contacts, according to an exemplary embodiment; and FIGS. 14A, 14B, 14C, and 14D each illustrate cross-sectional views of the semiconductor structure and buried power rail (BPR) and back-side power distribution network (BSPDN) formation, according to an exemplary embodiment.

Figure 6:
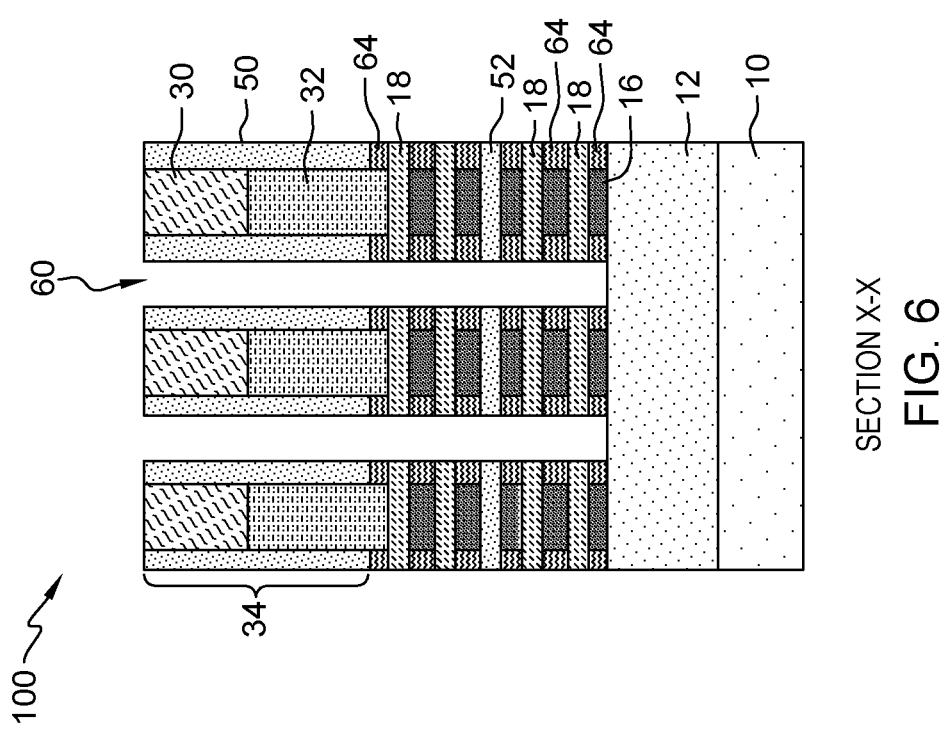
FIG. 6 illustrates a cross-sectional view of the semiconductor structure and illustrates nanosheet stack recess, silicon germanium layer indentation, and inner spacer formation, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

A hybrid contact scheme for stacked FET is disclosed with integration of a BSPDN. A double-sided (both frontside and backside of the wafer) contact scheme with buried power rail (BPR) and backside power distribution network (BSPDN) provides optimum contact and interconnect. In this disclosure, both top and bottom devices are fabricated using nanosheet transistors, however, the method and structure proposed in the present invention works for all device types. The stacked FET could include FINFET over FINFET, FINFET over nanosheet, nanosheet over nanosheet, and so forth. The use of nanosheet over nanosheet stacked FET in this disclosure are for illustration and are not intended to limit the scope of the present invention.

Some embodiments of the present invention are directed to a method of making a semiconductor device that alleviates at least two concerns in conventional processing including: (i) flipping the wafers twice during production; and (ii) printing the active region and gate twice, which increases cost and introduces potential misalignment between top and bottom of the transistor.

Some embodiments of the present invention are directed to forming stacked FETs with both front-side and back-side contact, where the bottom epitaxial growth is formed later from the wafer back-side, after the wafer is flipped, and a back-side contact connecting both top epitaxial growth and bottom epitaxial growth is formed.

Some embodiments of the present invention recognize the following facts, potential problems and/or potential areas for improvement with respect to the current state of the art: (i) typical CMOS (non-stacked) form nFET and pFET horizontally, or side-by-side; (ii) conventional integration schemes for stacked FETs require printing the active region and gate twice, which increases cost for each additional flip and leads to misalignment of the contacts.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, terms such as "depositing", "forming", and the like may refer to the disposition of layers, or portions of materials, in accordance with a given embodiment. Such processes may or may not be different than those used in the standard practice of the art of semiconductor device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, wet and/or dry etching processes, plasma etching processes, or any of the known etching processes in which material is removed.

Those skilled in the art understand that many different techniques may be used to add, remove, and/or alter various materials, and portions thereof, and that embodiments of the present invention may leverage combinations of such processes to produce the structures disclosed herein without deviating from the scope of the present invention.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A stacked field effect transistor (hereinafter "FET") may be formed by stacking at least one transistor over another one, and by doing so the footprint needed to occupy both transistors become less compared to conventional transistor layout where all devices are laid out at the same level.

The concept of buried power rail (BPR) refers to power rails that are buried below the back end of line (BEOL) metal stack, usually in-level with the transistor fins themselves. Back side power distribution networks (BSPDN), or grids, enable scaling beyond 5 nm with the back side being below the transistor substrate. The BPR technology enables the freeing up of resources for the dense logic connections often limiting modern processor performance. Further scaling of a standard logic cell is enabled by removing the overhead in the area occupied by the power rails. Finally, thicker low-resistance power rails are allowed, which enable lower voltage (IR) drops.

The present invention relates, generally, to the field of semiconductor manufacturing, and more particularly to fabricating stacked FETs integrated with a BSPDN. The stacked FET may include a n-type transistor, stacked on top of p-type transistor with double-sided contacts for improved contact and interconnect. The integration also enables flexibility of different device architectures, such as Fin over Fin, Fin over nanosheet, and different channel materials, such as SiGe and Ge.

Fabrication of a stacked FET with an integrated BSPDN is simplified to reduce handling, including only flipping the wafer once instead of flipping the wafer multiple times and printing the gate only once instead of twice, which further avoids misalignment when printing a second time. The simplified approach integrates the BSPDN with the BPR under the active region rather than the shallow trench isolation (STI) region. The backside local interconnect can connect the bottom epi to the BPR through buried power rail via (vBPR) or it can wire the bottom epi to BEOL interconnect through a deep trench contact. Some embodiments of the present invention form stacked FET integrated with BSPDN with only on wafer flip and only one gate patterning.

Some embodiments of the present invention are directed to a semiconductor device comprising at least a buried power rail (BPR) under a stacked transistor region, where a back-side local interconnect can connect the bottom epitaxial growth to the BPR through a buried power rail via. Alternatively, the back-side local interconnect can wire the bottom epitaxial growth to back-end-of-line (BEOL) interconnect through a deep trench contact.

Some embodiments of the present invention are directed to a method of forming a semiconductor device comprising the following steps: (i) forming stacked FET; (ii) forming a dummy gate and a spacer; (iii) forming a top epitaxial growth; (iv) forming a replacement gate; (v) forming a front-end-of-line (FEOL) contact and back-end-of-line (BEOL) interconnect; (vi) flipping the wafer; (vii) forming a bottom epitaxial growth; (viii) forming a back-side local interconnect; (ix) forming a back-side BPR and back-side power distribution network (BSPDN).

Some embodiments of the present invention disclose a structure and a method of forming a stacked nanosheet FET integrated with a BSPDN are described in detail below by referring to the accompanying drawings in FIGS. 1-14D, in accordance with an illustrative embodiment. FIG. 1 is an overhead view of an exemplary embodiment illustrating section lines X-X, Y-Y, Y'-Y', Y"-Y", and Y'"-Y'". These section lines are referenced throughout FIGS. 2-14 in the interest of not obscuring the presentation of embodiments of the present invention. It should be noted that the section Y'"-Y'" as illustrated herein refers to an alternative S/D structure that may be formed instead of the structure shown in section Y'-Y' but the two structures of sections Y'-Y' and Y'"-Y'" will not be present together in the same S/D region.

Referring now to FIG. 2, a semiconductor structure 100 (hereinafter "structure") at an intermediate stage of fabrication is shown according to an exemplary embodiment. FIG. 2 is a cross-sectional of the structure 100 across with subsequently formed gate lines. The structure 100 of FIG. 2 may be formed or provided.

The structure 100 may include a stack of alternating semiconductor layers 4 on a SiGe layer 14 on a stack of alternating semiconductor layers 6 on a substrate 8. The substrate 8 may be, for example, a layered semiconductor such as a SiGe-on-insulator, where a buried insulator layer, for example the insulator layer 12, separates a base substrate, for example the base substrate 10, from a stack of alternating semiconductor layers, for example alternating semiconductor layers 6. In an embodiment, the SiGe layer 16 is a silicon germanium layer having a relatively low concentration of germanium, such as, for example, a germanium concentration of 30 atomic percent or less. The SiGe layer 16 may have a thickness ranging from about 1 nm to about 50 nm, more preferably ranging from about 5 nm to about 40 nm, and most preferably ranging from about 8 nm to about 20 nm. The SiGe layer 14 is a silicon germanium layer having a relatively high concentration of germanium, such as, for example, a germanium concentration of 55 atomic percent or higher. The SiGe layer 14 may have a thickness ranging from about 10 nm to about 30 nm. Components of the structure 100 may be subsequently formed in or from the top semiconductor layer of the SOI silicon on insulator or SGOI (silicon-germanium on insulator) substrate.

In other embodiments, the substrate 8 may be a bulk substrate, which may be made from any of several known semiconductor materials such as, for example, silicon, germanium, silicon-germanium alloy, carbon-doped silicon-germanium alloy, and compound (e.g. III-V and II-VI)

semiconductor materials. Non-limiting examples of compound semiconductor materials include gallium arsenide, indium arsenide, and indium phosphide, or indium gallium arsenide. Typically, the substrate 8 may be approximately, but is not limited to, several hundred microns thick.

The stacks of alternating semiconductor layers 4, 6 (hereinafter "semiconductor stacks") is formed upon substrate 8. The semiconductor stacks 4, 6 includes vertically aligned alternating layers of sacrificial semiconductor material layer (sacrificial material layer) 16 and semiconductor channel material layer (channel layer) 18. The semiconductor stacks 4, 6 are sequentially formed upon substrate 8. As mentioned above, the semiconductor stacks 4, 6 include the sacrificial material layers 16 and the channel layers 18, which alternate one atop the other. In FIG. 2, and only by way of an example, the semiconductor stacks 4, 6 each include three layers of sacrificial material layer 16 and two layers of channel layer 18. The material stacks that can be employed in embodiments of the present invention are not limited to the specific embodiment illustrated in FIG. 2. Instead, the semiconductor stacks 4, 6 can include any number of sacrificial material layers 16 and channel layers 18. The semiconductor stacks 4, 6 are used to provide a gate all around device that includes vertically stacked semiconductor channel material nanosheets for a p-type field effect transistor (pFET) or n-type field effect transistor (nFET) device.

Each sacrificial material layer 16 is composed of a first semiconductor material which differs in composition from at least an upper portion of substrate 8. In an embodiment, the upper layer of the substrate 8 is composed of a buried insulator layer (the insulator layer 12), and each sacrificial material layer 16 is composed of silicon germanium. For example, in such an embodiment, each sacrificial material layer 16 may have a germanium concentration less than 50 atomic percent. In another example, each sacrificial material layer 16 may have a germanium concentration ranging from about 20 atomic percent to about 40 atomic percent. Each sacrificial material layer 16 can be formed using a deposition technique or an epitaxial growth technique.

Each channel layer 18 is composed of a second semiconductor material that has a different etch rate than the first semiconductor material of sacrificial material layers 16. The second semiconductor material can be, for example, silicon. The second semiconductor material, for each channel layer 18, can be formed utilizing an epitaxial growth or deposition technique.

The semiconductor stacks 4, 6 (each composed of layers 16, 18) can be formed by sequential epitaxial growth of alternating layers of the first semiconductor material and the second semiconductor material.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial material layers and the channel layers, respectively, can be performed utilizing any well-known precursor gas or gas mixture. Carrier gases like hydrogen, nitrogen, helium, and argon can be used.

The sacrificial material layers 16 of the semiconductor stacks 4, 6 may have a thickness ranging from about 5 nm to about 20 nm, while the channel layers 18 of the semiconductor stack 6 may have a thickness ranging from about 4 nm to about 12 nm. Each sacrificial material layer 16 may have a thickness that is the same as, or different from, a thickness of each channel layer 18. In an embodiment, each sacrificial material layer 16 has an identical thickness. In an embodiment, each channel layer 18 has an identical thickness.

Referring now to FIG. 3, the structure 100 is shown according to an exemplary embodiment. As shown in FIG. 3, after active region patterning (defining wanted semiconductor stacked sheets that comprise 4 and 6, and etching away the stacked sheets from unwanted regions), dummy gate 34 is formed by patterning methods known in the art.

The dummy gate includes dummy gate material layer 32 covered by hard mask material layer 30. The dummy gate layers 30, 32 are deposited over the semiconductor stack. The gate hard mask 30 may be formed over a horizontal upper surface of the dummy gate material layer 32, by methods known in the art. In an embodiment, the gate patterning process occurs only once to alleviate conventional misalignment concerns between the top device and bottom device where multiple patterning steps are required.

The dummy gate material layer 32 may comprise materials such as a thin SiO2 followed by deposition of polycrystalline silicon, amorphous silicon, and/or microcrystal silicon. The gate hard mask material layer 30 may comprise materials such as silicon oxide, silicon nitride, and/or silicon oxynitride.

Referring now to FIG. 4, the structure 100 is shown according to an exemplary embodiment. As shown in FIG. 4, the stack sacrificial material layer 14 may be selectively removed using one or more known techniques.

The stack sacrificial material layer 14 is removed selective to the sacrificial material layers 16, the channel layers 18, the dummy gate material layer 32, and the gate hard mask material layer 30. For example, a dry etching technique can be used to selectively remove the stack sacrificial material layer 14, such as, for example, using vapor phased HCl dry etch.

Referring now to FIGS. 5A and 5B the structure 100 is shown according to an exemplary embodiment. FIG. 5A is a cross-sectional view of the structure 100 along section line X-X (FIG. 1). FIG. 5B is a cross-sectional view of the structure 100 along section line Y-Y (FIG. 1) and is perpendicular to the cross-sectional view of FIG. 5A.

As shown in FIGS. 5A and 5B a gate spacer 50, a stack side spacer 54, and a middle dielectric layer (MDL) 52 are formed.

The gate spacer 50, the stack side spacer 54 and the middle dielectric layer (MDL) 52 may be formed after several processes, including for example, conformally depositing a dielectric layer (e.g. by ALD deposition), performing an anisotropic etch process to etch away the said dielectric layer from exposed horizontal surfaces. The stack side spacer 54, the gate spacer 50, and the middle dielectric layer (MDL) 52 may include any dielectric material such as silicon nitride, SiOCN, SiBCN, SiOC, etc. and may include a single layer or may include multiple layers of dielectric material.

A thickness of the stack side spacer 54, and the gate spacer 50, may range from about 6 nm to about 12 nm. The gate spacer 50 may be formed adjacent to vertical side surfaces of the dummy gate 34 including the dummy gate layer 32 and the gate hard mask material layer 30.

The MDL 52 may be formed where the stack sacrificial material layer 14 has been removed. The MDL 52 may be formed between the semiconductor stack 4, semiconductor stack 6, and the stack side spacer 54.

Referring now to FIG. 6, the structure 100 is shown according to an exemplary embodiment. As shown in FIG. 6, trench 60 may be formed between adjacent dummy gates 34 in the stacks of alternating semiconductor layers 4, 6 and in the middle dielectric layer 52, sacrificial material layers 16 are indented with respect to channel layer 18, and inner spacer 64 is formed.

Trench 60 may be formed in the stacks of alternating semiconductor layers 4, 6 made up of the sacrificial material layers 16 and the channel layers 18, and through the middle dielectric layer 52 by an anisotropic etching technique, such as, for example, reactive ion etching (RIE), and stopping at insulator layer 12.

Figure 7B:
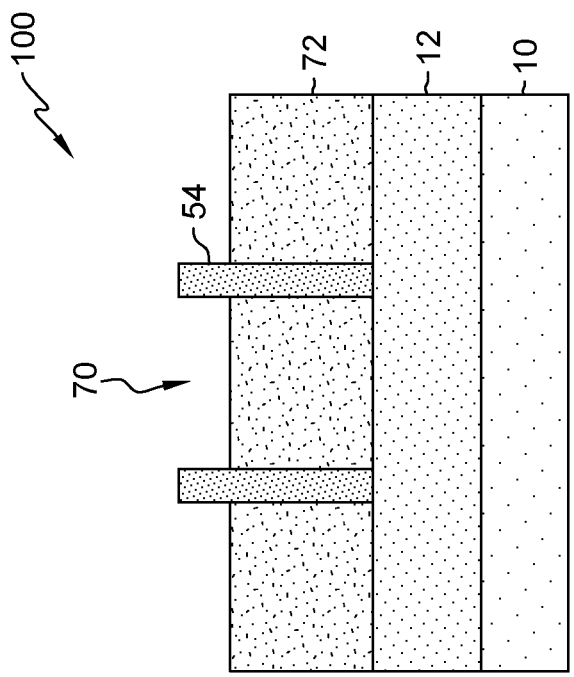
FIGS. 7A and 7B each illustrate cross-sectional views of the semiconductor structure and illustrate formation of a first inner layer dielectric and recess, according to an exemplary embodiment.
Figure 7A:
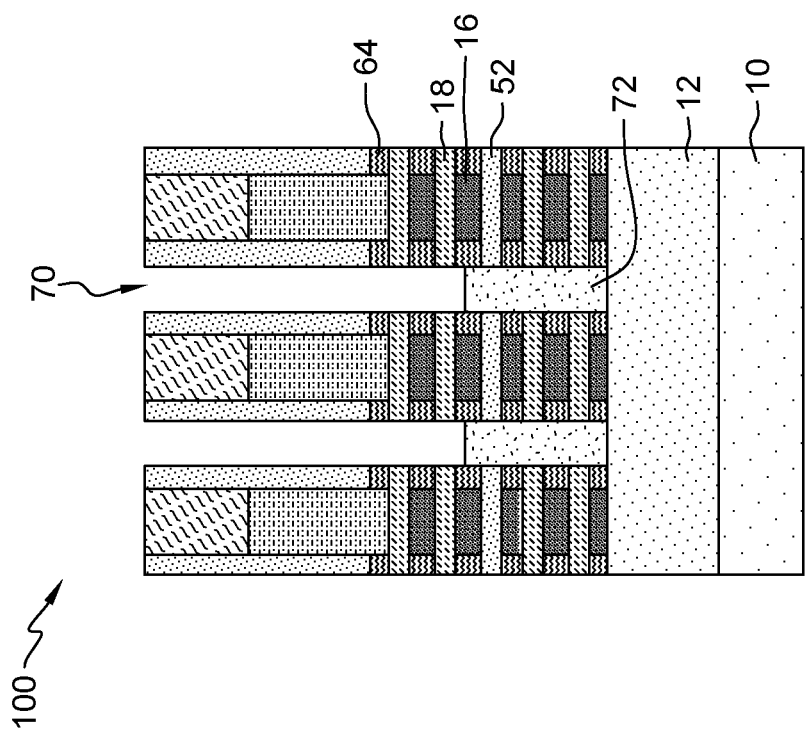

The sacrificial material layers 16 are indented to align with the vertical surfaces of dummy gates 34. Inner spacer 64 is formed within the indentation aligned with the vertical surface of dummy gate side spacer 50. The inner spacer is formed by a conformal dielectric deposition followed by isotropically etching back the deposited dielectric everywhere except the region that is fully pinched-off inside the indents Referring now to FIGS. 7A and 7B, the structure 100 is shown according to an exemplary embodiment. FIG. 7A is a cross-sectional view of the structure 100 along section line X-X (FIG. 1). FIG. 7B is a cross-sectional view of the structure 100 along section line Y-Y (FIG. 1) and is perpendicular to the cross-sectional view of FIG. 7A.

As shown in FIGS. 7A and 7B, a first inter-layer dielectric (ILD) 72 is formed in trench 60, a trench 70 is recessed into the ILD 72.

ILD 72 is formed, filling trench 60. ILD 72 is recessed to form trench 70. The ILD 72 could comprise with dielectric materials such as SiO2, SiN, SiC, SiCO, or combination of those materials. In this embodiment, SiO2 can be used as illustration. Trench 70 may be formed to a depth above the middle dielectric layer (MDL) 52 and at a height within the thickness of sacrificial material layer 16 in direct contact with MDL 52. Trench 70 may be formed by an isotropic or anisotropic etching technique, such as, for example, DHF wet oxide recess or reactive ion etching (RIE).

Referring now to FIGS. 8A and 8B, the structure 100 is shown according to an exemplary embodiment. FIG. 8A is a cross-sectional view of the structure 100 along section line X-X (FIG. 1). FIG. 8B is a cross-sectional view of the structure 100 along section line Y-Y (FIG. 1) and is perpendicular to the cross-sectional view of FIG. 8A.

As shown in FIGS. 8A and 8B, top source/drain region 80 is epitaxially grown in trench 70 from the exposed surface of the channel layer 18 of the semiconductor stack 4.

Referring now to FIGS. 9A and 9B, the structure 100 is shown according to an exemplary embodiment. FIG. 9A is a cross-sectional view of the structure 100 along section line X-X (FIG. 1). FIG. 9B is a cross-sectional view of the structure 100 along section line Y"-Y" (FIG. 1) and is perpendicular to the cross-sectional view of FIG. 9A.

As shown in FIGS. 9A and 9B, a second inner layer dielectric (ILD) 90 is formed to fill trench 70, hard mask material layer 30 is removed, dummy gate 34 is removed, sacrificial material layers 16 are released, and replacement metal gate (RMG) 92 is formed.

The second inner layer dielectric (ILD) 90 formed in trench 70 may be composed of a thin layer of SiN followed by SiO2, or any other suitable dielectrics. The hard mask material layer 30 is removed, exposing the top surface of the dummy gate material layer 32. The hard mask material layer 30 may be removed, for example, by a chemical mechanical polishing (CMP) technique which also polishes away the ILD2 that is overfilled.

The dummy gate material layer 34 is removed and the sacrificial material layers 16 are selectively removed via one or more steps according to techniques known in the art. The sacrificial material layers 16 are removed selective to the channel layers 18, middle dielectric layer (MDL) 52, inner spacer 64, and dummy gate side spacer 50. For example, a dry etch process can be used to selectively remove the sacrificial material layer 16, such as using vapor phased HCl dry etch.

Replacement metal gate (RMG) 92 is formed on structure 100, according to an exemplary embodiment. The RMG 92 is formed in each cavity of the semiconductor stacks 4, 6 and surrounding suspended portions of channel layers 18. The RMG 92 fills the cavity formed between dummy gate stack spacers where dummy gate material layer 32 was removed.

Figure 10B:
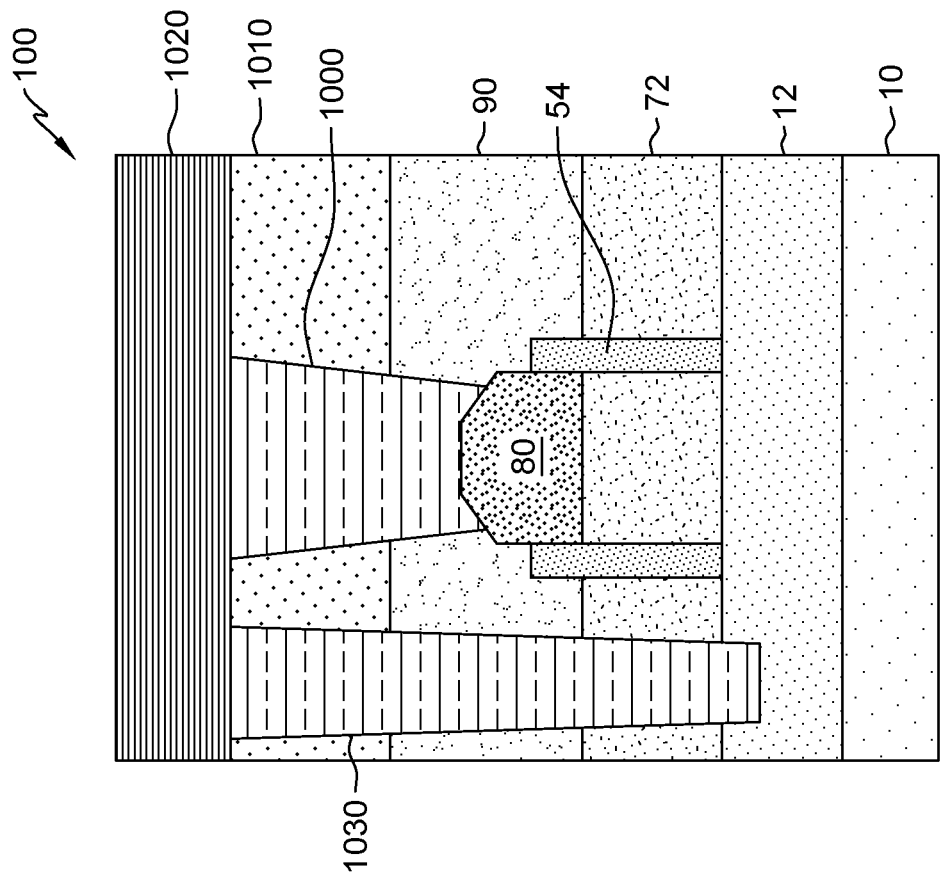
FIGS. 10A and 10B each illustrate cross-sectional views of the semiconductor structure and middle-of-line (MOL) contact and back-end of line (BEOL) formation, according to an exemplary embodiment.
Figure 10A:
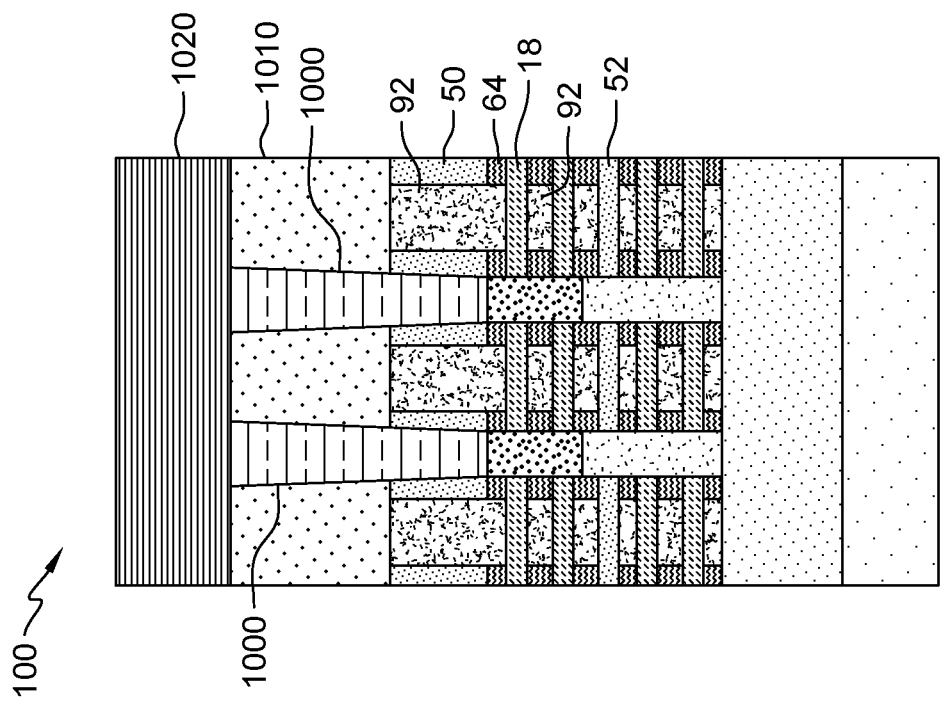

Referring now to FIGS. 10A and 10B, the structure 100 is shown according to an exemplary embodiment. FIG. 10A is a cross-sectional view of the structure 100 along section line X-X (FIG. 1). FIG. 10B is a cross-sectional view of the structure 100 along section line Y'-Y' (FIG. 1) and is perpendicular to the cross-sectional view of FIG. 10A.

As shown in FIGS. 10A and 10B, a middle of line inter-layer dielectric (MOL ILD) 1010 over the top surface, a middle of line (MOL) source/drain contact 1000 is formed in a trench over the top source/drain region 80, an MOL contact 1030 is formed in a deep trench terminating within the insulator layer 12, and back end of line (BEOL) interconnects 1020 is formed over the MOL ILD 1010 (please note that BEOL layers may comprise multiple metal layers, or even include far BEOL layers).

Referring now to FIG. 11, the structure 100 is shown according to an exemplary embodiment. As shown in FIG. 11, a carrier wafer 1100 is attached to the BEOL layer 1020, after that, the structure 100 is flipped over, and the substrate 10 is removed. The carrier wafer 1100 can be attached to BEOL layer 1020 through wafer bonding process, e.g. oxide-oxide bonding process. After that, the wafer is flipped, and substrate 10 can be thinned down firstly using a fast Si removal process such as grinding, followed by slower Si etching process with higher selectivity, stopping on dielectric 12.

Referring now to FIGS. 12A, 12B, and 12C, the structure 100 is shown according to an exemplary embodiment. FIG. 12A is a cross-sectional view of the structure 100 along section line X-X (FIG. 1). FIG. 12B is a cross-sectional view of the structure 100 along section line Y-Y (FIG. 1) and is perpendicular to the cross-sectional view of FIG. 12A. FIG. 12C is a cross-sectional view of the structure 100 along section line Y'-Y' (FIG. 1) and is perpendicular to the cross-sectional view of FIG. 12A.

As shown in FIGS. 12A, 12B, and 12C, bottom trench 1200 may be patterned in the insulator layer 12 and first inter-layer dielectric (ILD) 72 is recessed to expose the bottom channel sheets 18, and then bottom source/drain region 1210 is epitaxially grown in trench 1200 from the exposed surface of bottom channel sheets 18.

The bottom trench 1200 is formed by lithography followed by dry etch process which etches dielectric 12 stopping over dielectric 72. After that, ILD 72 is recessed to expose the bottom channel sheets 18. Please note that ILD 72 is not completely removed, and a portion of the ILD 72 is remained to isolate the bottom S/D epi 1210 to top S/D epi 80. The remaining thickness of the ILD 72 is thicker or with comparable thickness as MDL 52. As shown in FIG. 12B, the trench 1200 only connects bottom S/D epi 1210, and in FIG. 12C, it is shown that trench 1200 can be formed to connect the bottom S/D epi to contact 1030 that is drilled from the frontside of the wafer.

Referring now to FIGS. 13A, 13B, 13C, and 13D, the structure 100 is shown according to an exemplary embodiment. FIG. 13A is a cross-sectional view of the structure 100 along section line X-X (FIG. 1). FIG. 13B is a cross-sectional view of the structure 100 along section line Y'-Y' (FIG. 1) and is perpendicular to the cross-sectional view of FIG. 13A. FIG. 13C is a cross-sectional view of the structure 100 along section line Y"-Y" (FIG. 1) and is perpendicular to the cross-sectional view of FIG. 13A. FIG. 13D is a cross-sectional view of the structure 100 along section line Y'''-Y''' (FIG. 1) and is perpendicular to the cross-sectional view of FIG. 13A. Please note that the section Y'''-Y''' as shown herein refers to an alternative S/D structure that may be formed instead of the structure shown in Y'-Y', but the two structures will not be present together in the same S/D region.

As shown in FIGS. 13A, 13B, 13C, and 13D, backside local interconnects 1300, 1310, and 1320 are formed in openings including bottom trench 1200.

Backside local interconnects 1300, 1320 may be formed in each opening using conventional deposition techniques including, but not limited to: atomic layer deposition (ALD), chemical vapor deposition (CVD), molecular beam deposition (MBD), pulsed laser deposition (PLD), or liquid sourced misted chemical deposition (LSMCD). Electroplating, PVD deposition, etc. followed by metal CMP process. Additional blocked mask can be used to define internal contacts which connect top epi and bottom epi together (1310), by recessing the metal at those regions followed by dielectric fill and CMP.

The contacts 1300, 1320 may then be may be polished using a chemical mechanical polishing (CMP) technique to remove excess material and polish upper surfaces of the structure 100 until top surfaces of contacts 1300, 1320 are substantially coplanar with a top surface of the insulator layer 12.

The contacts 1300, 1310, 1320 may be made from any known metal, such as, for example, Al, W, Cu, Co, Zr, Ta, Hf, Ti, Ru, Pa, metal oxide, metal carbide, metal nitride, transition metal aluminides (e.g. Ti3Al, ZrAl), TaC, TiC, TaMgC, and any combination of those materials. The contacts 1300, 1310, 1320 may have one or more layers. In an embodiment, the contacts 1300, 1310, 1320 may have a bottom and sidewall layer of Ti, TiN or TaN The contacts 1300, 1320 may have an upper horizontal surface which is substantially coplanar with an upper horizontal surface of the insulator layer 12.

The contacts 1300, 1320 may provide an electrical signal or power supply to the bottom source/drain region 1210. Contact 1310 may provide an internal connection between the bottom source/drain region 1210 and the top source/drain region 80

Figure 14B:
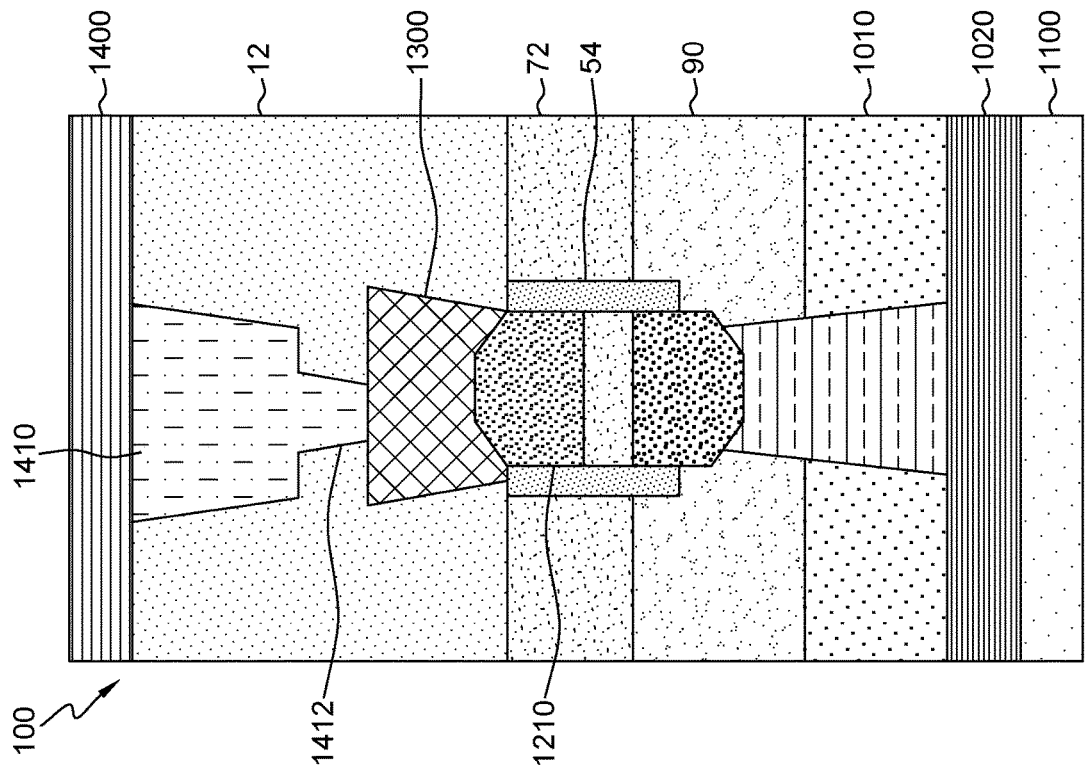
Figure 14A:
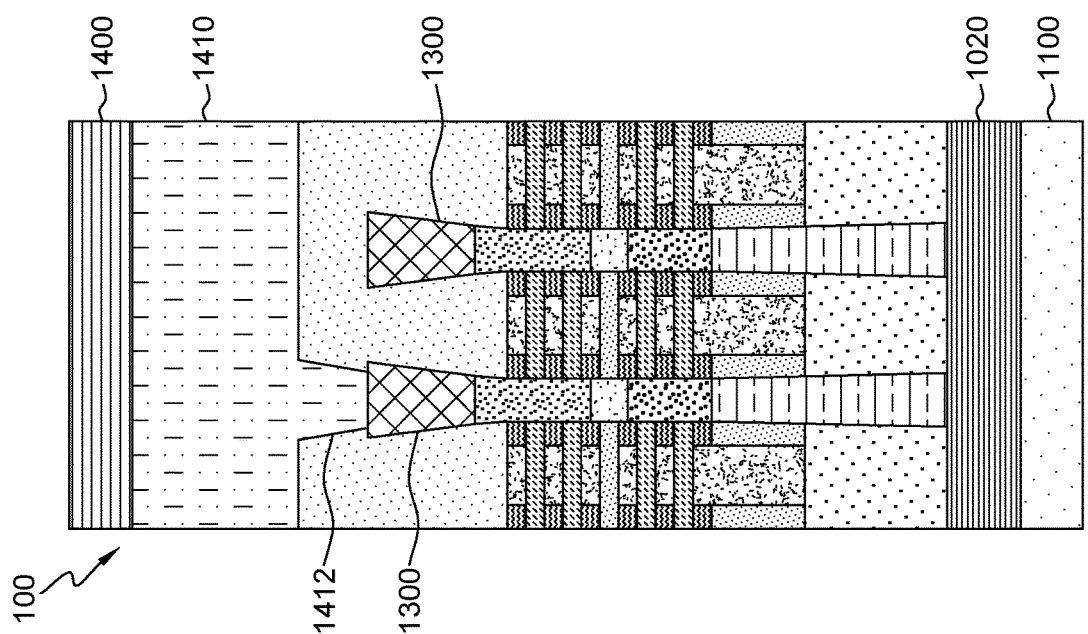

Referring now to FIGS. 14A, 14B, 14C, and 14D, the structure 100 is shown according to an exemplary embodiment. FIG. 14A is a cross-sectional view of the structure 100 along section line X-X (FIG. 1). FIG. 14B is a cross-sectional view of the structure 100 along section line Y-Y (FIG. 1) and is perpendicular to the cross-sectional view of FIG. 14A. FIG. 14C is a cross-sectional view of the structure 100 along section line Y'-Y' (FIG. 1) and is perpendicular to the cross-sectional view of FIG. 14A. FIG. 14D is a cross-sectional view of the structure 100 along section line Y'''-Y''' (FIG. 1) and is perpendicular to the cross-sectional view of FIG. 14A.

As shown in FIGS. 14A, 14B, 14C, and 14D, a buried power rail (BPR) 1410 and BPR via 1412 are deposited in insulator layer 12 and a back-side power distribution network (BSPDN) 1400 is formed over the top surface of the insulator layer 12 and buried power rail 1410. Additional layers of insulator layer 12 added and then recessed prior to the formation of the BPR and vBPR features. After the trench and via patterning for BPR and VBPR, metallization and CMP processes are performed.

FIG. 14A illustrates backside local interconnect 1300 may connect the bottom epitaxial growth 1210 to the buried power rail (BPR) 1410 through buried power rail via 1412.

FIG. 14B illustrates the upper source/drain region 80 separated by the first inter-layer dielectric (ILD) 72 from the bottom source/drain region 1210.

FIG. 14C illustrates backside local interconnect 1300 may wire the bottom epitaxial growth 1210 to the back end of line (BEOL) interconnect 1020 through a deep trench MOL contact 1030.

FIG. 14D illustrates local interconnect 1310 may be a local n/p stitch connecting the bottom epitaxial growth 1210 to the top epitaxial growth 80.

Some embodiments of the present invention may include one, or more, of the following features, characteristics and/or advantages: (i) forms both backside and frontside contacts; (ii) the backside and frontside contacts access source/drain epitaxial region of the hybrid stacked FETs; (iii) provides for backside interconnect to BPR connection at highly scalable dimensions; (iv) the BPR is formed under the active region instead of in shallow trench isolation region; (v) a local interconnect connects bottom epitaxial layer to either BPR level or BEOL level; and/or (vi) a local interconnect serves as local n/p epitaxial growth stitch.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A semiconductor structure comprising:
   a stacked pair of field-effect transistors (FETs) including a top FET and a bottom FET, the bottom FET in contact with a bottom source/drain region;

a buried power rail (BPR) in contact with the bottom source/drain region through a backside local interconnect; and a back end of line (BEOL) layer in electrical contact with the bottom source/drain region, wherein the electrical contact is made through a top deep trench contact in contact with the backside local interconnect.

2. The semiconductor structure of claim 1, further comprising:
a backside power distribution network (BSPDN) layer in direct contact with the BPR.

3. The semiconductor structure of claim 1, wherein the BPR further contacts the bottom source/drain through a buried power rail via.

4. The semiconductor structure of claim 1, further comprising:
the BEOL in contact with the top source/drain region through a topside local interconnect.

5. The semiconductor structure of claim 1, wherein the top FET is a nanosheet FET and the bottom FET is a FIN FET.

6. A semiconductor structure comprising:
a lower nanosheet stack on a buried insulator layer comprising alternating layers of a first metal gate layer and a semiconductor channel material vertically aligned and stacked one on top of another;

an upper nanosheet stack on a dielectric spacer layer comprising alternating layers of the metal gate layer and the semiconductor channel material vertically aligned and stacked one on top of another, the upper nanosheet stack on dielectric spacer layer vertically aligned and stacked on top of the lower nanosheet stack;

a pair of inner spacers disposed between adjacent nanosheet stack pairs including a lower nanosheet stack and an upper nanosheet stack, the pair of inner spacers oriented parallel to each other and vertically coplanar with and contacting the adjacent nanosheet stack pairs;

an upper source/drain region in direct contact with and located in an upper portion of the pair of inner spacers;

a lower source/drain region in direct contact with and located in a lower portion of the pair of inner spacers, the upper source/drain region and the lower source/drain region separated by an inter-layer dielectric and bounded vertically by the pairs of inner spacers;

located between a first pair of adjacent nanosheet stacks, a backside local interconnect disposed between a buried power rail (BPR) and the lower source/drain region, establishing electrical contact between the buried power rail (BPR) and the lower source/drain region; and located between a second pair of adjacent nanosheet stacks, a top deep trench contact disposed between a back end of line (BEOL) layer and the backside local interconnect, the backside local interconnect in direct contact with the bottom source/drain region, establishing electrical contact between the BEOL layer and the bottom source/drain region.

7. The semiconductor structure of claim 6, further comprising:
a backside power distribution network (BSPDN) layer above the BPR, the BSPDN making electrical contact with the bottom source/drain region located between the first pair of adjacent nano sheet stacks.

8. The semiconductor structure of claim 6, further comprising:
a buried power rail via in contact with the backside local interconnect and extending from the backside local interconnect to the BPR, establishing contact between the BPR and the bottom source/drain region.

* * * * *